(12) United States Patent
Jin

(10) Patent No.: US 11,173,788 B2
(45) Date of Patent: Nov. 16, 2021

(54) METHOD AND DEVICE FOR OPERATING A MOTOR VEHICLE

(71) Applicant: Robert Bosch GmbH, Stuttgart (DE)

(72) Inventor: Jiahang Jin, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/045,199

(22) PCT Filed: Mar. 14, 2019

(86) PCT No.: PCT/EP2019/056442
§ 371 (c)(1),
(2) Date: Oct. 5, 2020

(87) PCT Pub. No.: WO2019/192819
PCT Pub. Date: Oct. 10, 2019

(65) Prior Publication Data
US 2021/0039520 A1   Feb. 11, 2021

(30) Foreign Application Priority Data

Apr. 3, 2018   (DE) .................... 10 2018 204 968.8

(51) Int. Cl.
*B60L 58/20* (2019.01)
*B60L 3/04* (2006.01)
(Continued)

(52) U.S. Cl.
CPC ............. *B60L 3/04* (2013.01); *B60L 58/20* (2019.02); *G01R 31/52* (2020.01);
(Continued)

(58) Field of Classification Search
None
See application file for complete search history.

(56) References Cited

U.S. PATENT DOCUMENTS

| 2014/0132278 A1* | 5/2014 | Tang | G01R 31/007 |
| | | | 324/509 |
| 2015/0329001 A1* | 11/2015 | Eifert | B60L 3/00 |
| | | | 320/109 |

FOREIGN PATENT DOCUMENTS

| DE | 102004057694 | | 6/2006 | |
| DE | 102004057694 A1 * | 6/2006 | ............ B60W 10/08 |

(Continued)

OTHER PUBLICATIONS

International Search Report for Application No. PCT/EP2019/056442 dated Jun. 26, 2019 (English Translation, 2 pages).

*Primary Examiner* — Alfonso Perez Borroto
*Assistant Examiner* — Aqeel H Bukhari
(74) *Attorney, Agent, or Firm* — Michael Best & Friedrich LLP

(57) ABSTRACT

The invention relates to a method for operating a motor vehicle (2) which has an electric high-voltage network (3) and an electric low-voltage network (4), wherein the high-voltage network (3) has at least one traction battery (5) and at least one electric drive machine (6), the low-voltage network (4) has a vehicle electrical system battery (9), and the high-voltage network (3) is monitored for an electrical short-circuit and, upon detection of a short-circuit, the traction battery (5) is disconnected from the high-voltage network (3). According to the invention, in order to check the plausibility of the detected short-circuit before the traction battery (5) is reconnected to the high-voltage network (3), a boost current ($I_{HV}$) is applied to the high-voltage network (3) through the low-voltage network (4) by means of a DC/DC converter (11), and a boost voltage ($U_{HV}$) measured in the high-voltage network (3) is compared with an expected boost voltage ($U_{HV,soll}$).

17 Claims, 3 Drawing Sheets

(51) Int. Cl.
    *G01R 31/52*     (2020.01)
    *H02J 7/14*     (2006.01)

(52) U.S. Cl.
    CPC ..... *B60L 2210/10* (2013.01); *B60L 2240/547* (2013.01); *H02J 7/1423* (2013.01)

(56) References Cited

FOREIGN PATENT DOCUMENTS

| | | |
|---|---|---|
| DE | 102010056235 | 6/2012 |
| DE | 102011104224 | 12/2012 |

* cited by examiner

METHOD AND DEVICE FOR OPERATING A MOTOR VEHICLE

BACKGROUND OF THE INVENTION

A method for operating a motor vehicle which has an electrical high-voltage network and an electrical low-voltage network, wherein the high-voltage network has at least one traction battery and at least one electric drive motor, wherein the low-voltage network has a vehicle electrical system battery, and wherein the high-voltage network is monitored for an electrical short circuit and when a short circuit is detected the traction battery is isolated from the high-voltage network.

Furthermore, the invention relates to a device for operating a motor vehicle, as has been described above.

Methods and devices of the aforementioned type are known from the prior art. Present-day motor vehicles which have at least one electric drive motor use two voltage networks: a high-voltage network for operating the electric drive motor and a low-voltage network which forms the conventional vehicle electrical system and provides a low voltage between 12 and 24 volts, for example. The two networks are generally connected or can be connected to one another by way of a DC-DC converter which typically galvanically isolates the networks from one another and, if required, transmits energy from the one network into the other network. In particular, it is therefore possible to supply the high-voltage network through energy from the low-voltage network by means of the DC-DC converter. This mode of operation is described as a boost operation.

The electrical energy in the high-voltage network is either made available by the traction battery and/or the electric machine in generator operation. Due to the high voltage in the high-voltage network and the high energy content of the traction battery, it is important to avoid a short circuit in the high-voltage network. In order to protect the operator, monitoring the high-voltage network for a short circuit is therefore known so that it can be brought into a safe state as quickly as possible when a short circuit is detected. For this purpose, the traction battery can be electrically isolated from the high-voltage network, for example, so that when a short circuit is detected, the traction battery is isolated from the high-voltage network and the voltage supply to the high-voltage network is thus interrupted. However, this can also lead to false triggers, in the case of which the electrical connection between the traction battery and the high-voltage network is interrupted without a short circuit actually being present in the high-voltage network. Consequently, the traction battery is normally rejoined to the high-voltage network after a short circuit is detected, for example after a predeterminable time interval has passed. If there is a new notification of a short circuit, the traction battery is isolated again.

SUMMARY OF THE INVENTION

The method according to the invention has the advantage that a plausibility check of the detected short circuit is carried out before reconnecting the traction battery with the high-voltage network, in order to ensure that the traction battery is only rejoined to the high-voltage network if no short circuit was present and the isolation was carried out as a result of a falsely-reported short circuit. At the same time, a plausibility check ensures that the traction battery is prevented from being rejoined or reconnected to the high-voltage network if the short circuit has actually been correctly identified. For this purpose, in order to check the plausibility of the detected short circuit before reconnecting the traction battery with the high-voltage network, the invention makes provision for the high-voltage network to be supplied with a boost current by the low-voltage network by means of the DC-DC converter and for a boost voltage which is therefore generated in the high-voltage network to be measured and compared with an expected boost voltage. If the high-voltage network is operational, then no short circuit is present and the measured boost voltage will thus correspond to the expected boost voltage or approximately to the expected boost voltage. However, if a short circuit is present, then the measured boost voltage drops below the expected boost voltage and an error or rather a short circuit can be identified and checked for plausibility. This simple comparison of the expected boost voltage with the measured boost voltage thus makes it possible to check the plausibility of a short circuit detected previously in a simple and cost-effective manner.

Furthermore, provision is preferably made for the short circuit to be confirmed if, in the comparison, the difference of the measured boost voltage to the expected boost voltage deviates beyond a predeterminable threshold value. Forming the difference and the comparison with the threshold value ensures a particularly simple plausibility check. In this case, the threshold value is preferably specified depending on basic parameters, such as ambient temperature, power losses in the DC-DC converter and/or a current charge state of the vehicle electrical system battery.

Preferably, the short circuit is denied and the traction battery is reconnected to the high-voltage network if the difference is below the threshold value or corresponds to the threshold value. If the plausibility check thus results in the short circuit previously detected being denied, the traction battery is rejoined to the high-voltage network and normal operation of the motor vehicle is resumed.

Furthermore, provision is preferably made for the plausibility check to only be carried out if the energy which is available in the low-voltage network is greater than the stored energy in an intermediate circuit of an intermediate circuit capacitor of the high-voltage network. This ensures that the boost operation is possible and that a current can flow from the low-voltage network into the high-voltage network.

Furthermore, provision is preferably made for the available energy to be compared with the stored energy in the intermediate circuit taking into account the efficiency of the DC-DC converter and/or a power loss in the high-voltage network. As a result, the precision of the comparison is increased and the quality of the plausibility check is improved.

The expected boost voltage can be determined in a different manner. According to a first embodiment, the expected boost voltage is determined depending on an input power of the DC-DC converter. The input power is in particular calculated by measuring the input current and the input voltage of the DC-DC converter on the low-voltage side. Once the input power is known, the expected output power of the DC-DC converter and thus the boost voltage which can be expected in the high-voltage network can be calculated.

In particular, the efficiency of the DC-DC converter and/or the power loss in the high-voltage network is taken into account when determining the expected boost voltage. Determining the boost voltage is therefore further optimized.

According to a second embodiment, the expected boost voltage is preferably determined depending on a longitudinal resistance and a parallel resistance relative to the intermediate circuit capacitor. A longitudinal resistance and parallel resistance can be calculated and/or provided as additional components in the high-voltage network. Depending on the resistances of the stored energy in the intermediate circuit, the expected boost voltage in the high-voltage network can be calculated in a simple manner.

Preferably, the boost current is interrupted if the difference exceeds the predeterminable threshold value. This prevents components in the high-voltage network from being thermally overloaded.

The device according to the invention is characterized by the design as a control unit which is specifically modified to carry out the method according to the invention. The advantages already mentioned are evident therefrom.

BRIEF DESCRIPTION OF THE DRAWINGS

The invention is to be explained in greater detail hereinafter using the drawings. In the drawings.

DETAILED DESCRIPTION

Figure 1:
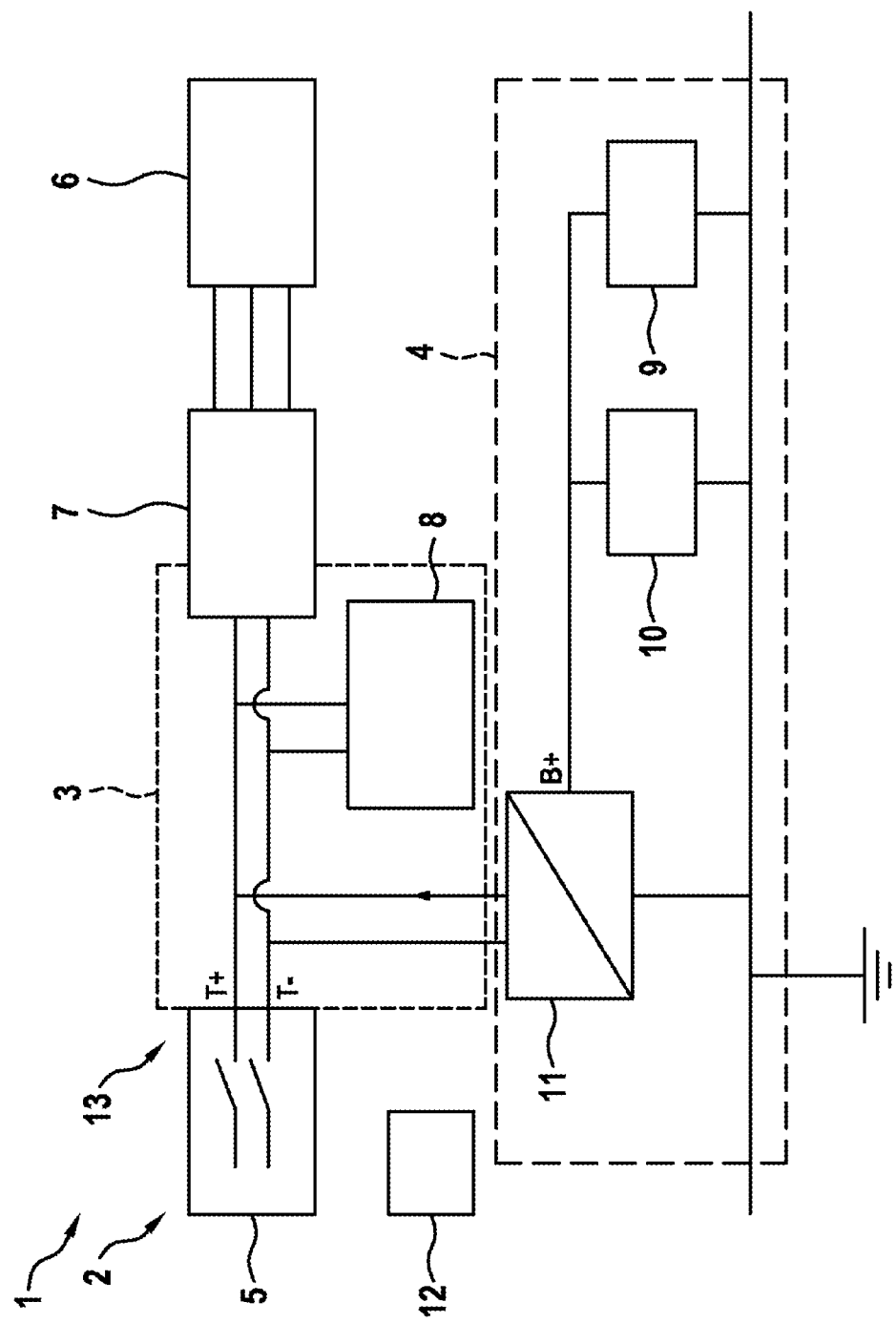
FIG. 1 shows an electrical system of a motor vehicle in a simplified representation.

In a simplified representation, FIG. 1 shows the electrical system 1 of a motor vehicle 2 which is not represented in greater detail here. The system 1 has a high-voltage network 3 and a low-voltage network 4. A traction battery 5, an electric machine 6, an inverter 7 which is connected upstream of the electric machine 6, as well as at least one high-voltage consumer 8 are associated with the high-voltage network 3. The low-voltage network 4 has a vehicle electrical system battery 9 as well as at least one low-voltage consumer 10.

The two networks 3, 4 are or can be electrically connected to one another by a controllable DC-DC converter 11.

Furthermore, a control unit 12 is present which actuates the DC-DC converter 11, the inverter 7 as well as the consumers 8, 10 and a switching device 13 associated with the high-voltage battery. The switching device 13 is designed to isolate the traction battery from the high-voltage network 3 if required. For this purpose, the switching device 13 in particular has actuatable battery contactors. Moreover, the control unit 12 is designed to carry out short circuit monitoring for the high-voltage network 3. Monitoring will check whether a short circuit is present in the high-voltage network 3. If this is the case, the switching device 13 is actuated and the traction battery 5 is isolated from the high-voltage network 3. This results in an optionally present short circuit current being interrupted and the high-voltage network 3 being disconnected and transferred into a safe state. However, the short circuit identification function can also have false triggers which are not caused by an actual short circuit in the high-voltage network 3. It is therefore advantageous to restart the high-voltage network 3 after opening the battery contactors and after a predeterminable period of time has passed, for example, by actuating the switching device 13 to restore the connection between the traction battery 5 and the high-voltage network 3. As a result, the availability of the entire system 1 is increased.

In order to ensure that the switching device 13 has not been actuated or opened as a result of a short circuit which is actually present and that reconnecting the traction battery 5 to the high-voltage network does not lead to a further short circuit, the method described hereinafter is provided, by means of which a short circuit test or rather a plausibility check is carried out before reconnecting the traction battery 5 to the high-voltage network 3.

For this purpose, all consumers 8 and 10 are firstly deactivated by the control unit 12 and a so-called boost operation is set up by means of the DC-DC converter 11, by means of which boost operation the high-voltage network 3 is fed or supplied with energy by the low-voltage network 4.

Figure 2:
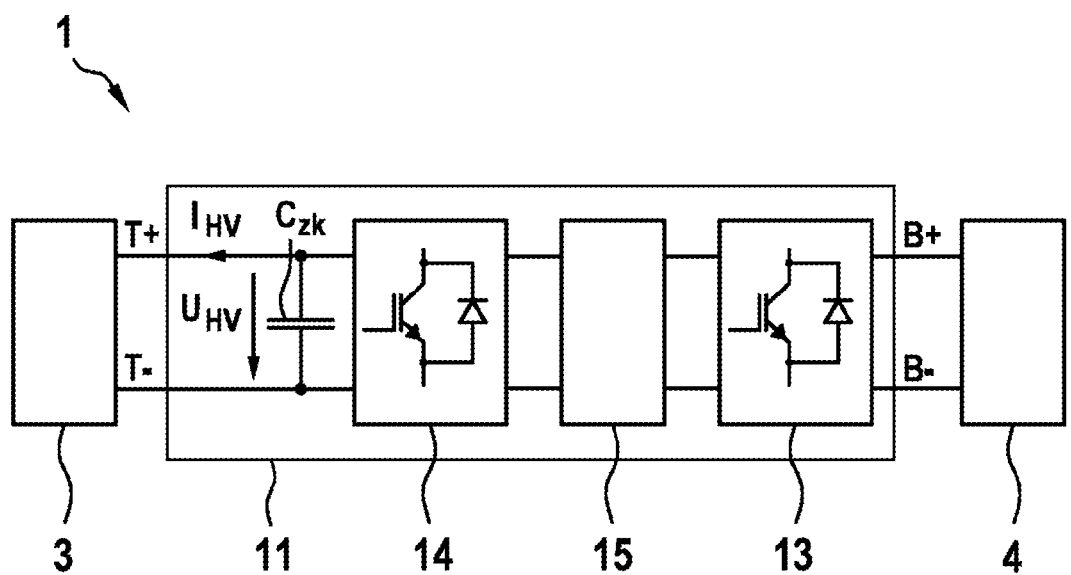
FIG. 2 shows a simplified representation of an exemplary embodiment of the DC-DC converter of the electrical system.

FIG. 2 shows, in a simplified manner, the DC-DC converter 11 which is connected between the high-voltage network 3 and the low-voltage network 4. The DC-DC converter 11 is designed as a bidirectionally operating DC-DC converter. In order to carry out the boost process, it has a rectifier on the low-voltage side and an inverter 14 on the high-voltage side. A transformer 15 is connected between the rectifier 13 and inverter 14, which transformer raises the voltage level of the low-voltage network 4 to that of the high-voltage network 3. An intermediate circuit capacitor $C_{zk}$ is connected on the high-voltage side, parallel to the inverter 14.

The control unit 12 firstly checks whether the electrical energy in the low-voltage network 4 is sufficient in order to charge the high-voltage network 3. The available electrical energy in the low-voltage network depends heavily on the current charge state of the vehicle electrical system battery 9. Depending on the operating state, the voltage in the low-voltage network should at least maintain one voltage in order to supply the consumer 10, in particular the safety-relevant consumer 10. The electrical energy which is actually available in the vehicle electrical system battery 9 should be determined for the boost operation. Taking into account the current operating temperature T, the charge state SOC of the vehicle electrical system battery 9 (SOC=state of charge), the operative condition SOH of the vehicle electrical system battery 9 (SOH—state of health) and the lower battery voltage threshold $U_S$, which depends on the current operating state, the available electrical energy emerges from:

$$E_v = f(T, SOC, SOH, U_S)$$

A short circuit point does not always have good conductivity if the voltage acting on the short circuit point is small. The voltage in the high-voltage network 3 is therefore increased to such an extent that at least one normal operating voltage $U_{HV,min}$ is reached. Therefore, the following applies to the energy $E_{zk,min}$ stored in the intermediate circuit or intermediate circuit capacitor $C_{zk}$:

$$E_{zx,\,min} = \tfrac{1}{2} C_{zk} U_{HV,\,min}^2$$

Taking into account the efficiency n of the DC-DC converter 11 and the power loss $E_{vl}$ in the high-voltage network 3, which results from a self-discharge and/or the discharge resistor, for example, the following condition should be checked:

$$E_v > \frac{E_{zk,min}}{n} + E_{vl}$$

If this condition is met, the boost operation can be carried out. Correspondingly, the control unit 12 triggers the DC-DC converter 11 to drive a boost current $I_{HV}$ into the high-voltage network 3. With the traction battery 5 isolated from the high-voltage network 3 and the disconnected consumers 8, the intermediate circuit voltage would have to increase during the boost operation.

Hereinafter, an expected boost voltage $U_{HV,soll}$ is compared with a measured boost voltage $U_{HV,mess}$. If the difference between these two exceeds a predeterminable threshold value $U_{HV,S}$, a malfunction is identified or the short circuit which is present in the high-voltage network 3 is confirmed/checked for plausibility. As a result, the DC-DC converter 11 is deactivated again by the control unit 12 and the boost operation is stopped. Moreover, the traction battery is prevented from being reconnected to the high-voltage network 3.

The expected boost voltage $U_{HV,Soll}$ is preferably determined by one of the two methods described hereinafter.

For the first method, the input power $P_{DCDC,in}$ of the DC-DC converter 11 is determined in the boost operation by measuring the input voltage of the low-voltage network $U_{lv}$ and measuring the input current $I_{lv}$:

$$P_{DCDC,in} = U_{LV} I_{LV}$$

Taking into account the efficiency n and the power loss in the high-voltage network 3 without the traction battery 5 $P_{vl}$, the power for charging the high-voltage network is to be calculated as follows:

$$P_{HV} = n U_{LV} - P_{vl}$$

From the energy balance, the following then applies:

$$\int_{t=t1}^{x} P_{HV} dt = \frac{1}{2} C_{ZK} U_{HV,soll}^2$$

The expected voltage $U_{HV,soll}$ is calculated at any time by adjusting the above formula.

Figure 3:
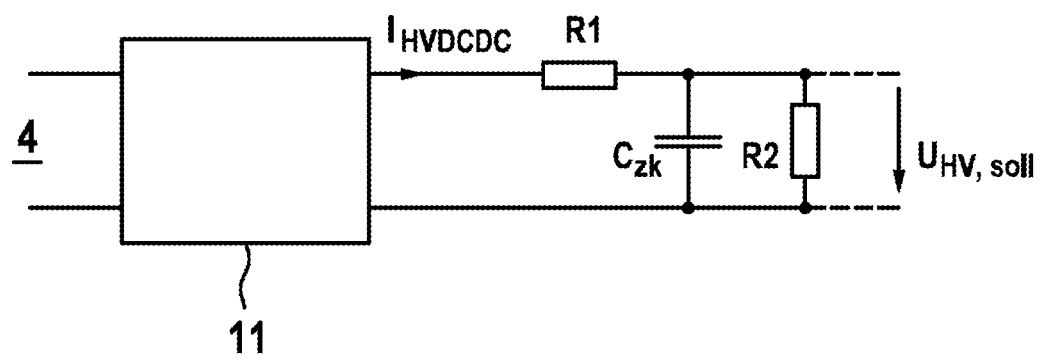
FIG. 3 shows a further exemplary embodiment of the DC-DC converter in a simplified representation.

In the second method, a simplified circuit model is set up as shown in FIG. 3. A high-voltage current $I_{HVDCDC}$ as well as the boost voltage $U_{HV(t=t_1)}$ at the starting point of the boost operation are measured. A longitudinal resistance R1 and parallel resistance R2 are preferably estimated or determined by way of experiments. The intermediate circuit capacitor $C_{ZK}$ is already taken into account in the circuit design. The following therefore applies:

$$U_{HV,soll} = U_{HVDCDC, Mod} = f(I_{RVDCDC}(t), R_1, R_2, C, U_{HV}(t=t_1))$$

The expected boost voltage $U_{HV,soll}$ is compared with the measured boost voltage $U_{HV}$. If their difference exceeds $U_{HV,diff}$ then a short circuit is ascertained or checked for plausibility in the high-voltage network 3. In this case, in order to avoid a possible thermal overload of components in the high-voltage network 3, the boost operation is interrupted. As already mentioned previously, the switching device 13 is also prevented from being actuated again in order to connect the traction battery 5 to the high-voltage network 3.

If the difference between the expected boost voltage and the measured boost voltage remains below the threshold value $U_{HV,diff}$ during the boost operation, the high-voltage network 3 can be reactivated and in addition the switching device 13 can be actuated, so that the traction battery 5 is reconnected to the high-voltage network 3.

Figure 4:
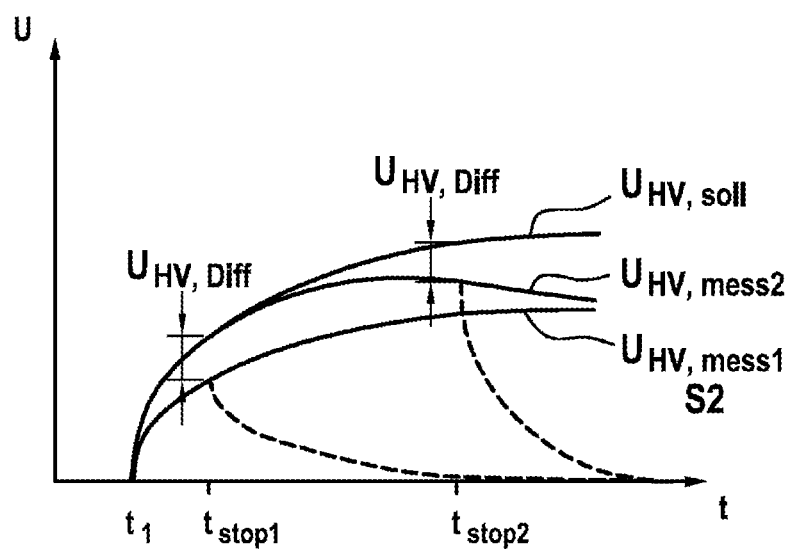
FIG. 4 shows voltage curves of the DC-DC converter and FIG. 5 shows an advantageous method for operating the motor vehicle.

FIG. 4 shows exemplary voltage curves U over time t by means of two error situations. In the first case, the short circuit occurs only after reaching a specific voltage in the high-voltage network 3 ($U_{HV,mess1}$). and, in the second case, the short circuit permanently precharges ($U_{HV,mess2}$).

Figure 5:
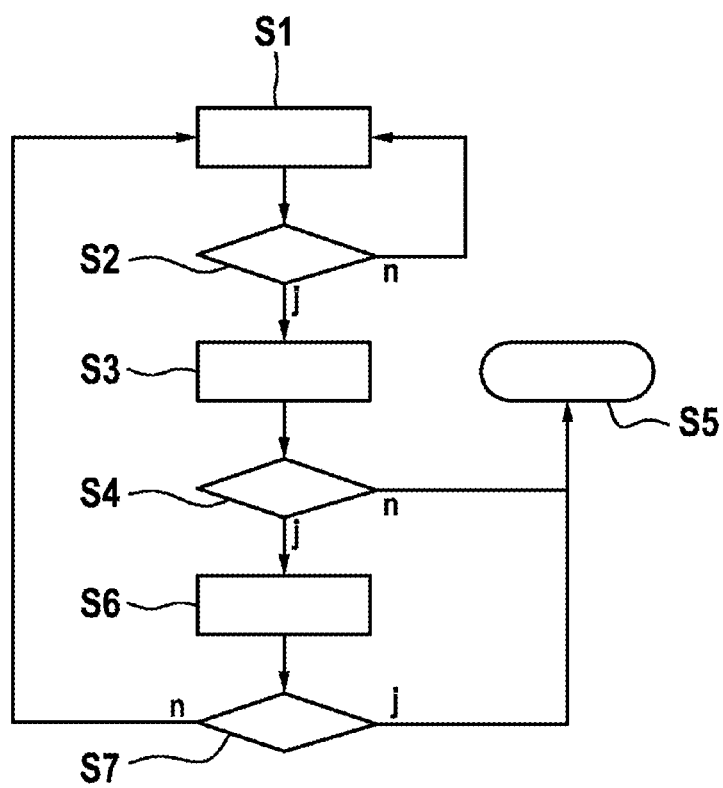

FIG. 5 shows the method described above once again summarized in a simplified manner. In step S1, the system 1 is put into operation and normal operation is assumed. In step S2, the high-voltage network 3 is monitored for short circuits. Step S1 continues if no short circuit is present. However, if a short circuit is identified (j), the switching device 13 is actuated in the subsequent step S3 in order to isolate the traction battery 5 from the high-voltage network 3.

In a step S4, it is then checked whether the energy which is available in the low-voltage network is sufficient in order to charge the high-voltage network 3. If this is not the case (n), the high-voltage network 3 is permanently deactivated in a step S5 by permanently preventing the traction battery 5 from being reconnected to the high-voltage network 3.

However, if the energy is sufficient (j), the boost operation is carried out in a step S6, as explained previously, and the above-described query to check the plausibility of the short circuit is carried out in a step S7 by comparing the expected boost voltage with a measured boost voltage. In this case, if the short circuit is confirmed/checked for plausibility, the system 1 is disconnected according to step S5. However, if the short circuit is not confirmed (n), step S1 continues by actuating the switching device 13 in order to connect the traction battery 5 to the high-voltage network 3.

The invention claimed is:

1. A method for operating a motor vehicle (2) which has an electrical high-voltage network (3) and an electrical low-voltage network (4), wherein the high-voltage network (3) has at least one traction battery (5) and at least one electric drive motor (6), wherein the low-voltage network (4) has a vehicle electrical system battery (9), and wherein the high-voltage network (3) is monitored for an electrical short circuit and when a short circuit is detected the traction battery (5) is isolated from the high-voltage network (3), the method comprising:
   checking the plausibility of the detected short circuit before reconnecting the traction battery (5) to the high-voltage network (3) by supplying the high-voltage network (3) with a boost current ($I_{HV}$) from the low-voltage network (4) via a DC-DC converter (11); and
   comparing a boost voltage ($U_{HV}$) which is measured in the high-voltage network (3) to an expected boost voltage ($U_{HV,soll}$).

2. The method as claimed in claim 1, further comprising confirming the short circuit when a difference of the measured boost voltage ($U_{HV}$) to the expected boost voltage ($U_{HV,soll}$) deviates beyond a threshold value.

3. The method as claimed in claim 1, connecting the traction battery (5) to the high-voltage network (3) when a difference of the measured boost voltage ($U_{HV}$) to the expected boost voltage ($U_{HV,soll}$) is below a threshold value or corresponds to the threshold value.

4. The method as claimed in claim 1, further comprising determining whether energy ($E_v$) available in the low-voltage network (4) is greater than stored energy in an intermediate circuit of an intermediate circuit capacitor ($C_{ZK}$) of the high-voltage network (3).

5. The method as claimed in claim 4, wherein the energy ($E_v$) available in the low-voltage network (4) is compared with the stored energy in the intermediate circuit taking based on the efficiency of the DC-DC converter (11) and/or a power loss in the high-voltage network (3).

6. The method as claimed in claim 1, wherein the expected boost voltage ($U_{HV,soll}$) is determined based on an input power of the DC-DC converter (11).

7. The method as claimed in claim 1, wherein the expected boost voltage ($U_{HV,soll}$) is determined based on the efficiency of the DC-DC converter (11) and/or the power loss in the high-voltage network (3).

8. The method as claimed in claim 1, wherein the expected boost voltage ($U_{HV,soll}$) is determined based on a longitudinal resistance ($R_1$) and a parallel resistance ($R_2$) relative to the intermediate circuit capacitor ($C_{ZK}$).

9. A device for operating a motor vehicle (2) which has an electrical high-voltage network (3) and an electrical low-voltage network (4), wherein the high-voltage network (3) has at least one traction battery (5) and at least one electric drive motor (6), wherein the low-voltage network (4) has a vehicle electrical system battery (9), and wherein the high-voltage network (3) is configured to be connected to the low-voltage network (4) by a DC-DC converter (11), as the device comprising a control unit (12) configured to
    check the plausibility of the detected short circuit before reconnecting the traction battery (5) to the high-voltage network (3) by supplying the high-voltage network (3) with a boost current ($I_{HV}$) from the low-voltage network (4) via the DC-DC converter (11); and
    compare a boost voltage ($U_{HV}$) which is measured in the high-voltage network (3) to an expected boost voltage ($U_{HV,soll}$).

10. An electrical system (1) of a motor vehicle (2) with the high-voltage network (3) for the traction battery (5) and the low-voltage network (4) for the vehicle electrical system battery (9), wherein the high-voltage network (3) is connected to the low-voltage network (4) by the DC-DC converter (11), comprising the device as claimed in claim 9.

11. The electrical system (1) according to claim 10, wherein the control unit (12) is configured to confirm the short circuit when a difference of the measured boost voltage ($U_{HV}$) to the expected boost voltage ($U_{HV,soll}$) deviates beyond a threshold value.

12. The electrical system (1) according to claim 10, wherein the control unit (12) is configured to connect the traction battery (5) to the high-voltage network (3) when a difference of the measured boost voltage ($U_{HV}$) to the expected boost voltage ($U_{HV,soll}$) is below a threshold value or corresponds to the threshold value.

13. The electrical system (1) according to claim 10, wherein the control unit (12) is configured to determine whether energy ($E_v$) available in the low-voltage network (4) is greater than stored energy in an intermediate circuit of an intermediate circuit capacitor ($C_{ZK}$) of the high-voltage network (3) to check the plausibility of the detected short circuit.

14. The electrical system (1) according to claim 13, wherein the control unit (12) is configured to compare the energy ($E_v$) available in the low-voltage network (4) with the stored energy in the intermediate circuit taking based on the efficiency of the DC-DC converter (11) and/or a power loss in the high-voltage network (3).

15. The electrical system (1) according to claim 10, wherein the control unit (12) is configured to determine the expected boost voltage ($U_{HV,soll}$) based on an input power of the DC-DC converter (11).

16. The electrical system (1) according to claim 10, wherein the control unit (12) is configured to determine the expected boost voltage ($U_{HV,soll}$) based on a longitudinal resistance ($R_1$) and a parallel resistance ($R_2$) relative to the intermediate circuit capacitor ($C_{ZK}$).

17. The method as claimed in claim 2, further including reconnecting the traction battery with the high-voltage network (3) when the difference of the measured boost voltage (UHV) to the expected boost voltage (UHV,soll) is below the threshold value or corresponds to the threshold value.

* * * * *